(12) United States Patent
Lin et al.

(10) Patent No.: US 11,009,920 B1
(45) Date of Patent: May 18, 2021

(54) ADJUSTABLE HINGE MODULE FOR INFORMATION HANDLING SYSTEMS

(71) Applicant: Dell Products L.P., Round Rock, TX (US)

(72) Inventors: Chung-An Lin, Taipei (TW); Li Hsu, Taipei (TW)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/744,730

(22) Filed: Jan. 16, 2020

(51) Int. Cl.
*G06F 1/16* (2006.01)
*H05K 7/16* (2006.01)

(52) U.S. Cl.
CPC .......... *G06F 1/1681* (2013.01); *G06F 1/1601* (2013.01); *H05K 7/16* (2013.01)

(58) Field of Classification Search
CPC ........ G06F 1/1681; G06F 1/1601; H05K 7/16
See application file for complete search history.

(56) References Cited

U.S. PATENT DOCUMENTS

| | | | | |
|---|---|---|---|---|
| 5,028,913 A | * | 7/1991 | Kitamura | G06F 1/1681 361/679.27 |
| 6,832,412 B2 | * | 12/2004 | Kim | E05F 1/1215 16/354 |
| 8,782,853 B2 | * | 7/2014 | Ge | F16C 11/06 16/354 |
| 2010/0071159 A1 | * | 3/2010 | Myung | H04M 1/022 16/303 |
| 2013/0219661 A1 | * | 8/2013 | Ge | F16C 11/06 16/367 |

\* cited by examiner

*Primary Examiner* — Adrian S Wilson
*Assistant Examiner* — Theron S Milliser
(74) *Attorney, Agent, or Firm* — Baker Botts L.L.P.

(57) ABSTRACT

A hinge assembly for a computing system, including a hinge assembly coupled to a base bracket of a display assembly, including: a sleeve including a hollow portion at a first end of the sleeve; a retractable shaft, wherein a first end of the retractable shaft is positioned within the hollow portion of the sleeve, the retractable shaft adjustable between a first positional state and a second positional state with respect to the sleeve such that: when the retractable shaft is in the first positional state, a second end of the retractable shaft, opposite the first end, extends a first distance from a second end of the sleeve, opposite the first end of the sleeve; when the retractable shaft is in the second position state, the second end of the retractable shaft extends a second distance from the second end of the sleeve, the second distance greater than the first distance.

16 Claims, 9 Drawing Sheets

ADJUSTABLE HINGE MODULE FOR INFORMATION HANDLING SYSTEMS

BACKGROUND

Field of the Disclosure

The disclosure relates generally to an adjustable hinge module used in information handling systems.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Stands for computing systems (e.g., all-in-one systems) can be located differently based on the particular computing system, and support different display sizes based on the particular computing system. To compensate for tilt forces on various panel sizes of computing systems, individual hinges are required. Each hinge can have different torsion spring forces and frictional forces to compensate for such different tilt forces, but there is no universal hinge that can compensate for a variety of tilt forces.

SUMMARY

Innovative aspects of the subject matter described in this specification may be embodied in a hinge module for an information handling system, including a base bracket coupled to a display assembly of the information handling system; a hinge assembly coupled to the base bracket, including: a sleeve including at least a hollow portion at a first end of the sleeve; a retractable shaft, wherein a first end of the retractable shaft is positioned within the hollow portion of the sleeve, the retractable shaft adjustable between a first positional state and a second positional state with respect to the sleeve such that: when the retractable shaft is in the first positional state, a second end of the retractable shaft, opposite the first end of the retractable shaft, extends a first distance from a second end of the sleeve, opposite the first end of the sleeve; and when the retractable shaft is in the second position state, the second end of the retractable shaft extends a second distance from the second end of the sleeve, the second distance greater than the first distance.

These and other embodiments may each optionally include one or more of the following features. For instance, when the retractable shaft is in the first positional state, the hinge assembly prevents tilting of the display assembly for a first tilt force less than a first threshold, and when the retractable shaft is in the second positional state, the hinge assembly prevents tilting of the display assembly for a second tilt force less than a second threshold, the second threshold greater than the first threshold. The sleeve further including a first pair of recesses and a second pair of recesses positioned within the hollow portion of the sleeve, the retractable shaft further including a compressible pin such that when the compressible pin is positioned within the first pair of recesses, the retractable shaft is in the first position, and when the compressible pin is positioned with the second pair of recesses, the retractable shaft is in the second position. The compressible pin, when positioned within the first pair of recesses or the second pair of recesses, is fully extended, and when positioned between the first pair of recesses and the second pair of recesses, is compressed. The second end of the retractable shaft includes a hollow portion, the hinge module further including: a torsion spring positioned around the hinge assembly; a ratchet stopper coupled to the torsion spring; and an adjustable shaft, wherein a first end of the adjustable shaft is positioned within the hollow portion of the retractable shaft, the adjustable shaft including a second end that engages the ratchet stopper to adjust a state of the torsion spring such that when the adjustable shaft is in a first position with respect to the ratchet stopper, the torsion spring applies a first hinge force to the base bracket, and when the adjustable shaft is in a second position with respect to the ratchet stopper, the torsion spring applies a second hinge force to the base bracket. Further comprising an outer sheath, the outer sheath being hollow, with a portion of the retractable shaft and a portion of the adjustable shaft positioned within the outer sheath such that the torsion spring is positioned around the outer sheath. Further comprising a compression spring positioned around the first end of the adjustable shaft to prevent movement of the adjustable shaft in a direction along an axis of the hinge assembly. One or more teeth of the adjustable shaft engage one or more teeth of the ratchet stopper to establish the positioning of the adjustable shaft with respect to the ratchet stopper. The adjustable shaft is positionally rotatable with respect to the retractable shaft to adjust between the first position and the second position.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-13 wherein like numbers are used to indicate like and corresponding parts.

Figure 1:
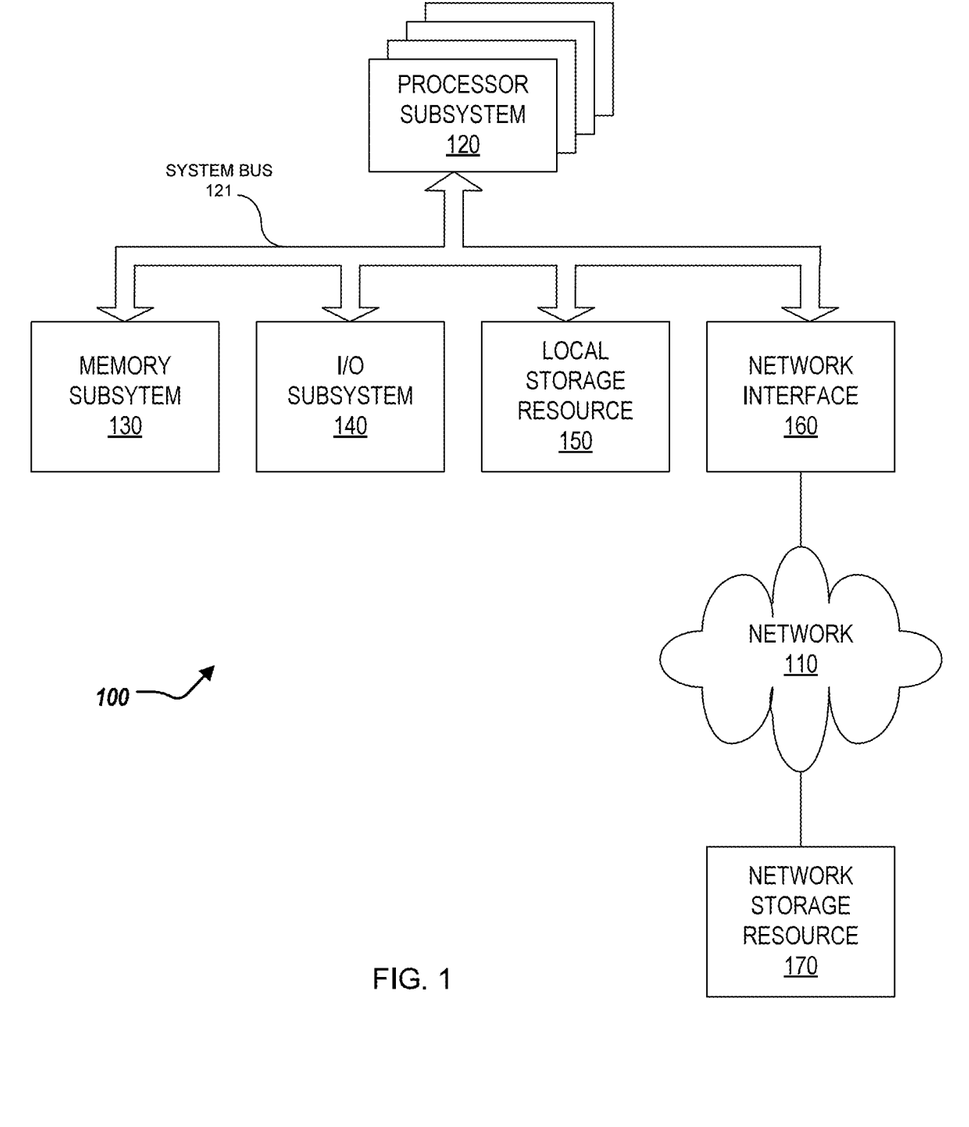
FIG. 1 is a block diagram of selected elements of an embodiment of an information handling system.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

Figure 2A:
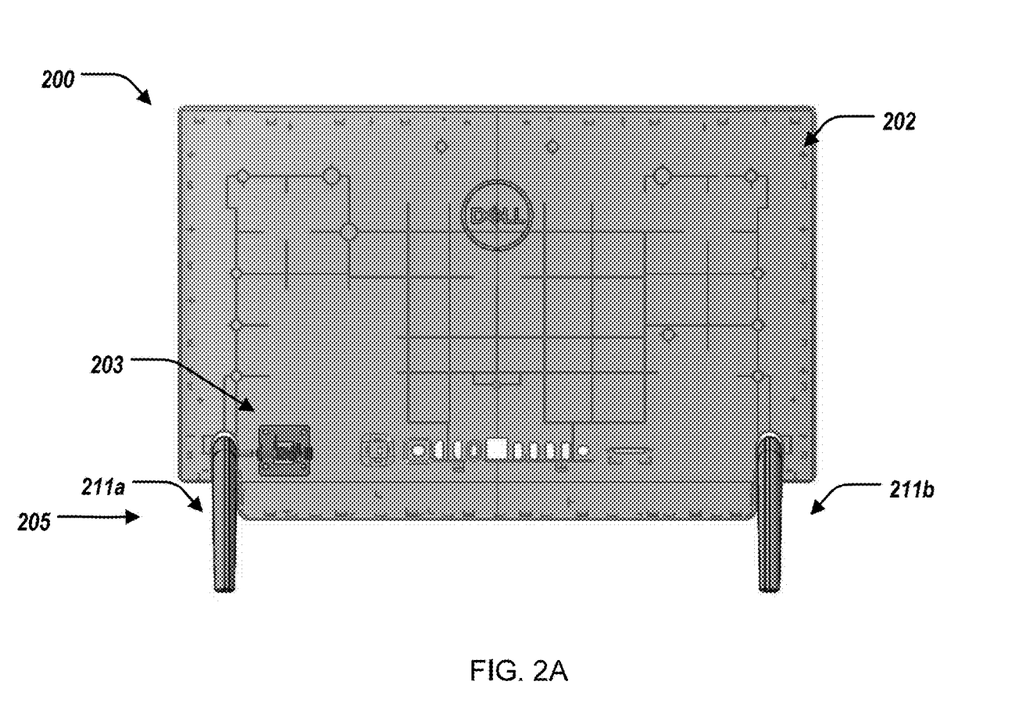
FIGS. 2A, 2B illustrate an information handling system including a display device.
Figure 2B:
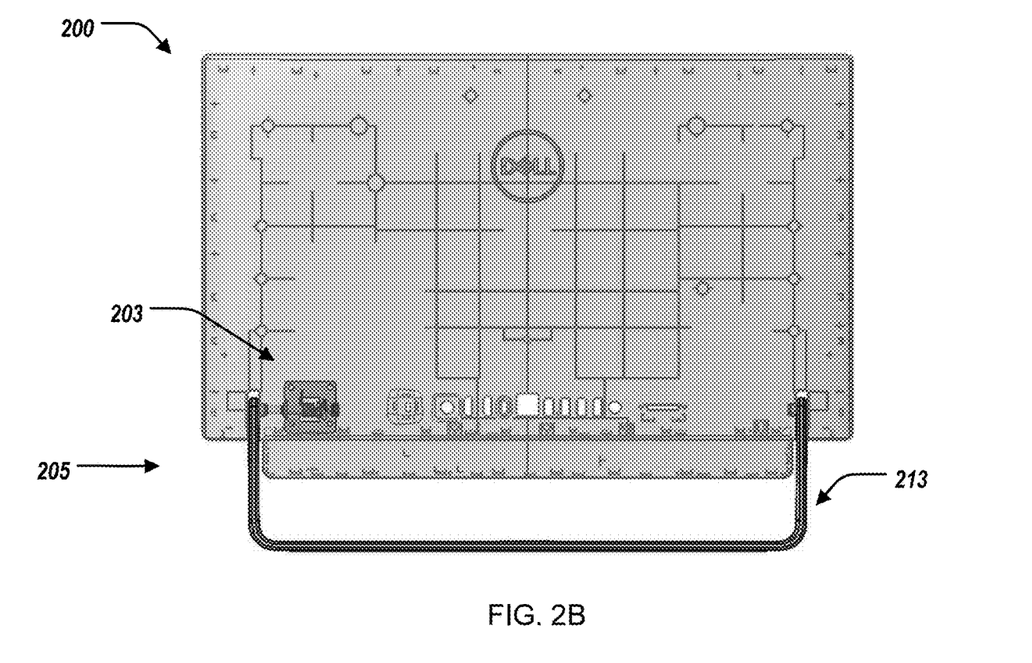

Turning now to FIGS. 2A, 2B, FIGS. 2A, 2B illustrates an information handling system (IHS) 200 including a display assembly 202, a hinge module 203, and a support system 205. The hinge module 203 can be coupled to the display assembly 202 and to the support system 205. The hinge module 203 can facilitate obtaining a desired angle between the display assembly 202 and the support system 205, with the support system 205 providing structural support to the display assembly 202. The angle between the display assembly 202 and the support system 205 can be adjusted via the hinge module 203, described further herein. In some examples, the IHS 200 includes a portion or all of the information handling system 100 of FIG. 1. In some examples, the IHS 200 can be an all-in-one (AIO) system.

In some examples, as shown in FIG. 2A, the support system 205 can include individual supports 211a, 211b, with the display assembly 202 having a first size (e.g., a first diagonal screen size). For example, the diagonal screen size of the display assembly 202 that includes the support system 205 having individual supports 211a, 211b can be 24 inches. In some examples, as shown in FIG. 2B, the support system 205 can include a connected support 213, with the display assembly 202 having a second size (e.g., a second diagonal screen size). For example, the diagonal screen size of the display assembly 202 that includes the support system 205 having the connected support 213 can be 27 inches.

Figure 3:
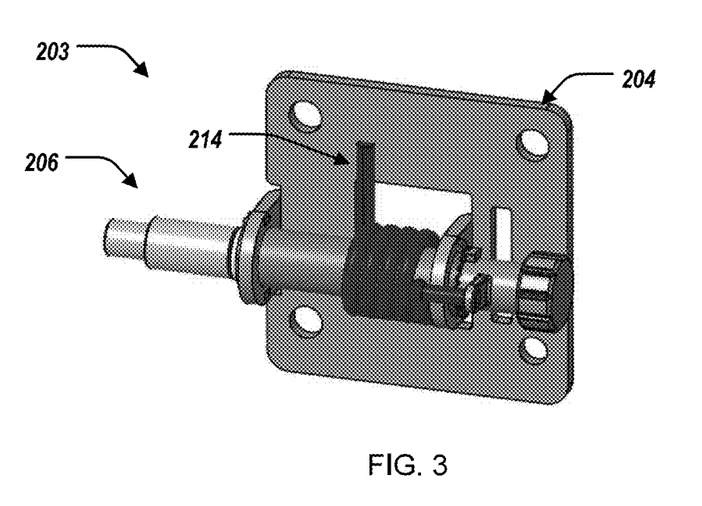
FIG. 3 illustrates a hinge module in a first state.

FIG. 3 illustrates the hinge module 203 including a base bracket 204, a hinge assembly 206, and a torsion spring 214. The base bracket 204 can be coupled to the display assembly 202, as shown in FIGS. 2A, 2B. In some examples, the IHS 200 can include two or more respective base brackets 204 and hinge assemblies 206. The hinge assembly 206 can be coupled to the base bracket 204.

Figure 4:
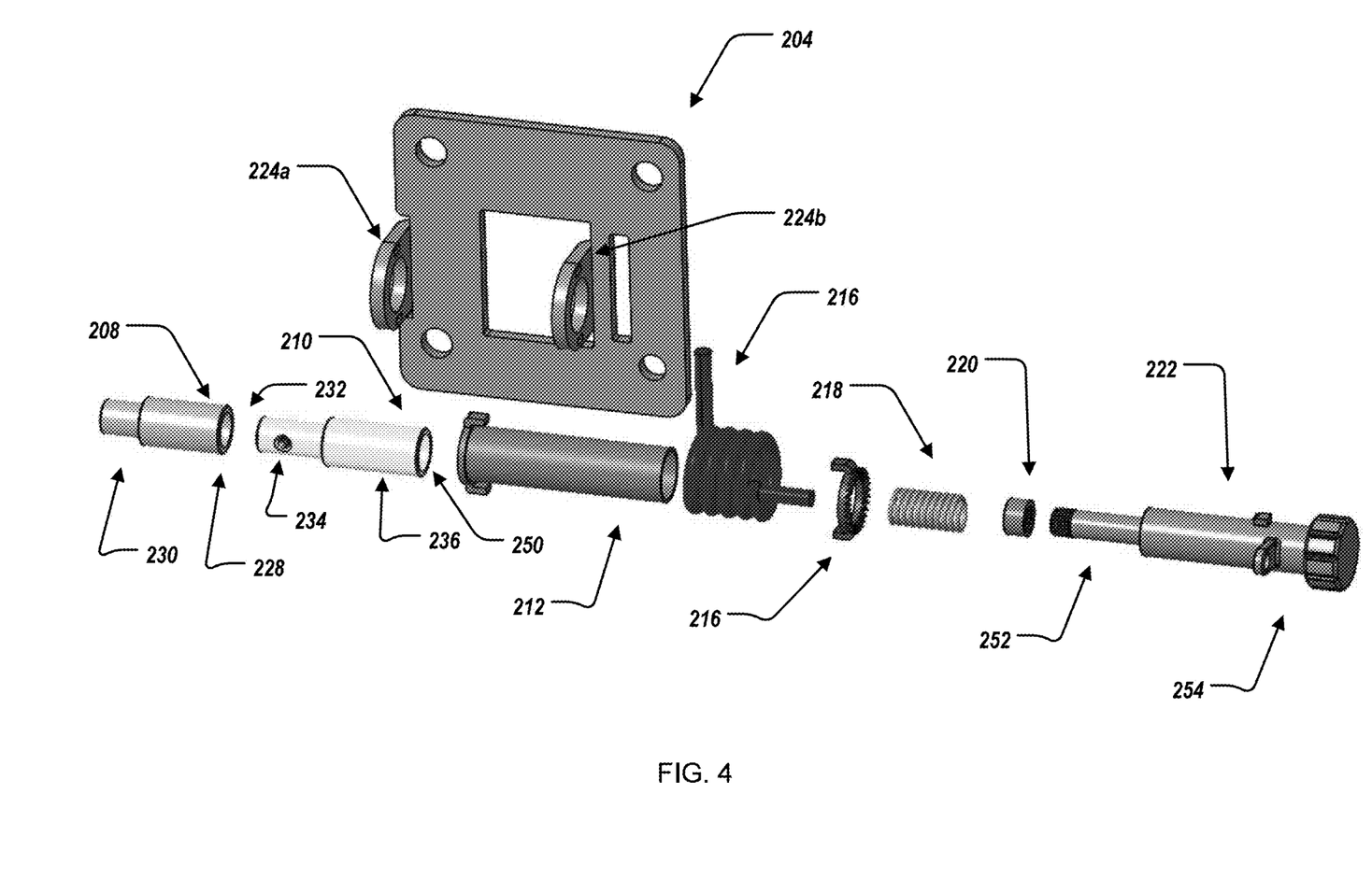
FIG. 4 illustrates an exploded view of the hinge module.

Referring to FIGS. 3 and 4, the hinge assembly 206 can include a sleeve 208, a retractable shaft 210, an outer sheath 212, a ratchet stopper 216, a compression spring 218, a nut 220, and an adjustable shaft 222. The base bracket 204 can include coupling elements 224a, 224b (collectively referred to as coupling elements 224) that include respective through holes through which the hinge assembly 206 can be positioned and coupled to.

Figure 5:
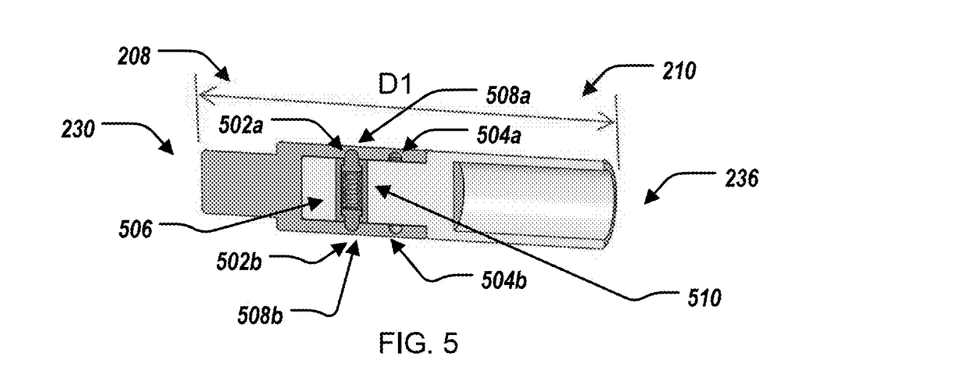
FIG. 5 illustrates a retractable shaft of the hinge module in the first state.
Figure 8:
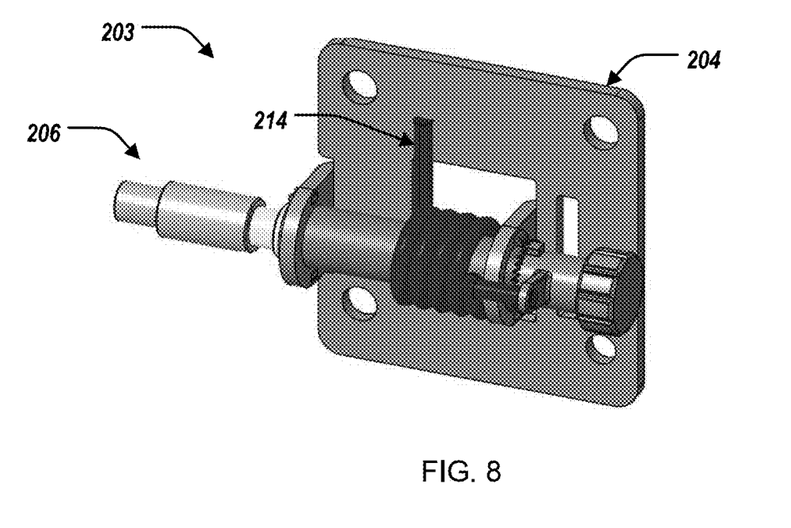
FIG. 8 illustrates the hinge module in a second state.

Referring to FIGS. 4 and 5, the sleeve 208 can include a first end 228 and a second end 230 that is opposite to the first end 228. The first end 228 of the sleeve 208 can include a hollow portion 232. The retractable shaft 210 can include a first end 234 and a second end 236 that is opposite to the first end 234. The first end 234 of the retractable shaft 210 can be positioned within the hollow portion 232 of the sleeve 208. The retractable shaft 210 is adjustable between a first positional state (as shown in FIG. 3) and a second positional state (as shown in FIG. 8), described further herein.

The outer sheath 212 can be hollow such that at least a portion of the retractable shaft 210 and a portion of the adjustable shaft 222 is positioned within the outer sheath 212. The torsion spring 214 can be positioned around the hinge assembly 206, and specifically, positioned around the outer sheath 212. The ratchet stopper 216 can be coupled to the torsion spring 214.

Figure 6:
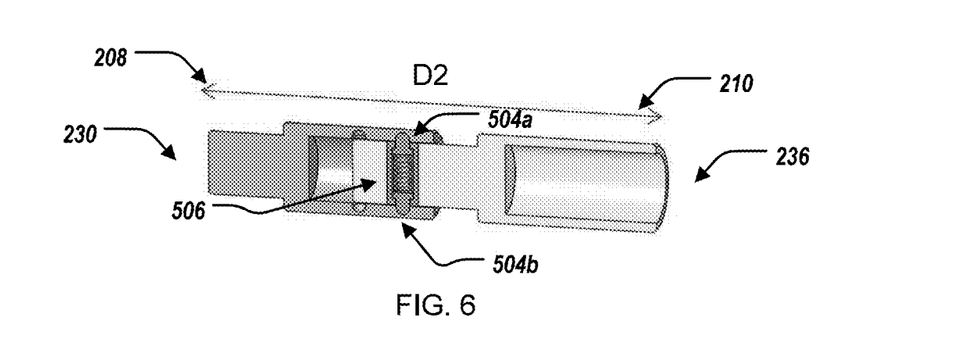
FIG. 6 illustrates the retractable shaft of the hinge module in a second state.

As shown in FIG. 5, the retractable shaft 210 is in the first positional state. Specifically, when the retractable shaft 210 is in the first positional state, the second end 236 of the retractable shaft 210 extends a first distance D1 from the second end 230 of the sleeve 208. In some examples, the first distance is approximately 30 millimeters. As shown in FIG. 6, the retractable shaft 210 is in the second positional state. Specifically, when the retractable shaft 210 is in the second positional state, the second end 236 of the retractable shaft 210 extends a second distance D2 from the second end 230 of the sleeve 208. The second distance D2 is greater than the first distance D1. In some examples, the second distance D2 is approximately 35.8 millimeters.

Figure 7A:
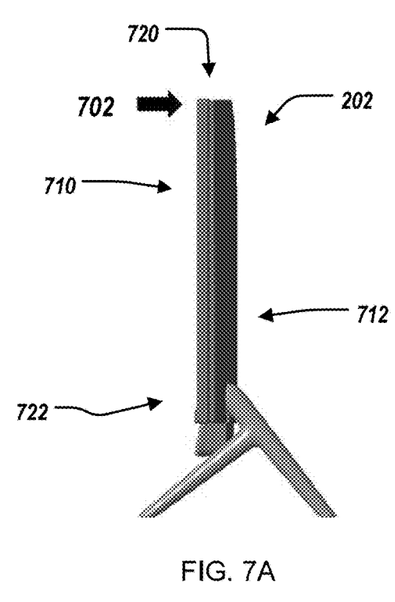
FIGS. 7A, 7B illustrate the information handling system with application of a tilt force.

To that end, when the retractable shaft 210 is in the first positional state, as shown in FIGS. 3 and 5, the hinge assembly 206 prevents titling of the display assembly 202 for a first tilt force less than a first threshold. Referring to FIG. 7A, for example, a user can apply a first tilt force 702 to the display assembly 202 to rotate the display assembly 202 about the hinge assembly 206. The tilt force 702 can be applied at a first side 710 of the display assembly 202. In some examples, the first side 710 of the display assembly 202 is opposite to a second side 712 of the display assembly 202 that the base bracket 204 is coupled to. The tilt force 702 can be applied at a first end 720 of the display assembly 202. In some examples, the first end 720 of the display assembly 202 is opposite to a second end 722 of the display assembly 202 that the base bracket 204 is coupled to. In some examples, when the display assembly 202 includes the first display screen size as shown in FIG. 2A (e.g., 24 inches), the first threshold is a tilt force of 1.0 kilogram force (kgf).

Figure 7B:
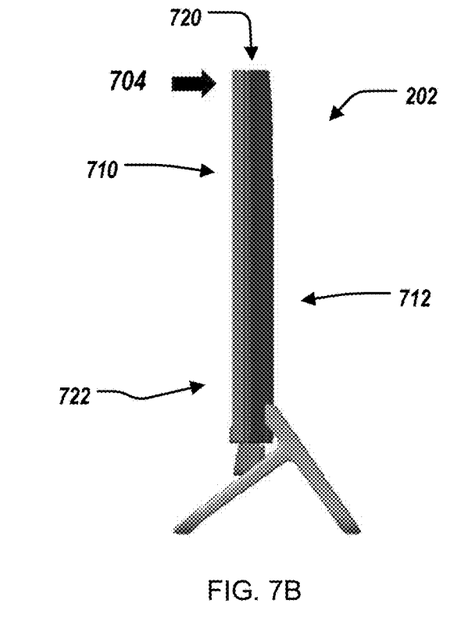

When the retractable shaft 210 is in the second positional state, as shown in FIGS. 6 and 8, the hinge assembly 206 prevents tilting of the display assembly 202 for a second tilt force greater than a second threshold. Referring to FIG. 7B, for example, the user can apply the second tilt force 704 to the display assembly 202 to rotate the display assembly 202 about the hinge assembly 206. The tilt force 704 can be applied at the first side 710 of the display assembly 202, and applied at the second end 720 of the display assembly 202. The second threshold can be greater than the first threshold. In some examples, when the display assembly includes the second display screen size as shown in FIG. 2B (e.g., 27 inches), the second threshold is a tilt force of 1.2 kilogram force (kgf).

Referring back to FIG. 5, the sleeve 208 can include a first pair of recesses 502a, 502b (collectively referred to as first recesses 502) and a second pair of recesses 504a, 504b (collectively referred to as second recesses 504). The first recesses 502 and the second recesses 504 are positioned within the hollow portion 232 of the sleeve 208. The retractable shaft 210 can further include a compressible pin 506. The compressible pin 506 can include pin heads 508a, 508b (collectively referred to as pinheads 508) and a spring 510. The spring 510 can be positioned between the pin heads 508. To that end, when the retractable shaft 210 is in the first positional state, the compressible pin 506 is positioned within the first recesses 502 and the compressible pin 506 is fully extended. That is, the spring 510 exerts opposing forces on the pin heads 508 such that the pins heads 508 are positioned within the first recesses 502 and the retractable shaft 210 is in the first positional state.

Furthermore, referring to FIG. 6, when the retractable shaft 210 is in the second positional state, the compressible pin 506 is positioned within the second recesses 504 and the compressible pin 506 is fully extended. That is, the spring 510 exerts opposing forces on the pin heads 508 such that the pin heads 508 are positioned within the second recesses 504 and the retractable shaft 210 is in the second positional state.

Figure 9:
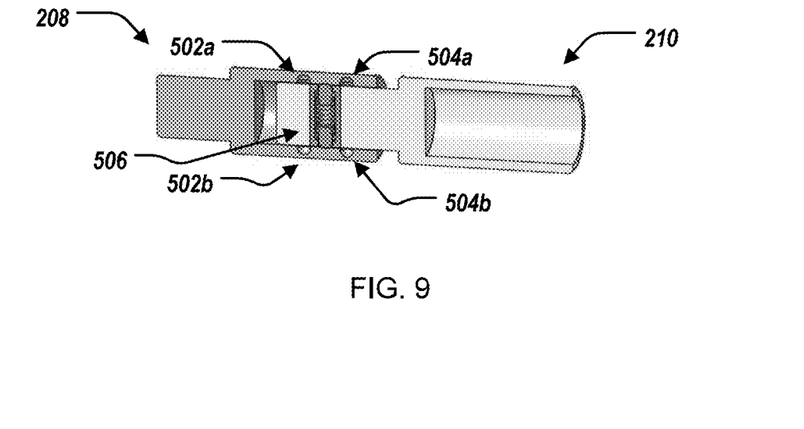
FIG. 9 illustrates the retractable shaft between the first and the second states.

Moreover, referring to FIG. 9, when the retractable shaft 210 is between the first and the second positional states, e.g., when the retractable shaft 210 is translated along an axis of the retractable shaft 210, the compressible pin 506 is positioned between the first recesses 502 and the second recesses 504 and the compressible pin 506 is compressed. That is the hollow portion of the 232 of the sleeve 208 exerts a force on the pin heads 508 such that the compressible pin 506 is compressed and positioned between the first recesses 502 and the second recesses and the retractable shaft 210 is between the first and the second positional states.

Figure 10:
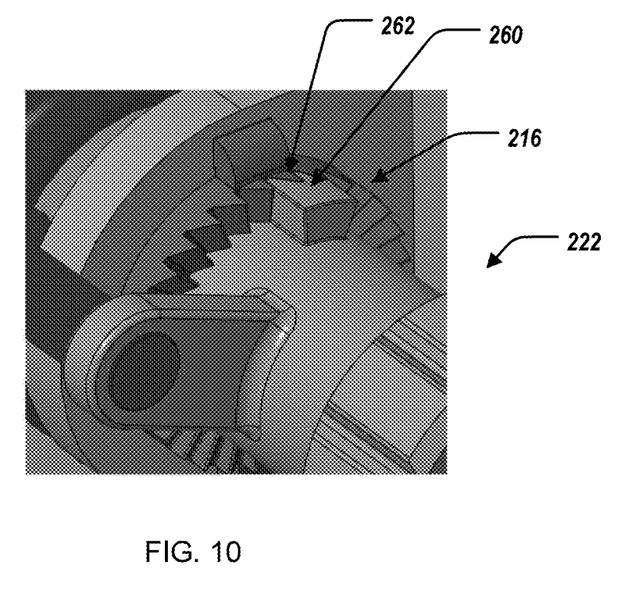
FIG. 10 illustrates an adjustable shaft of the hinge module in a first state.
Figure 11:
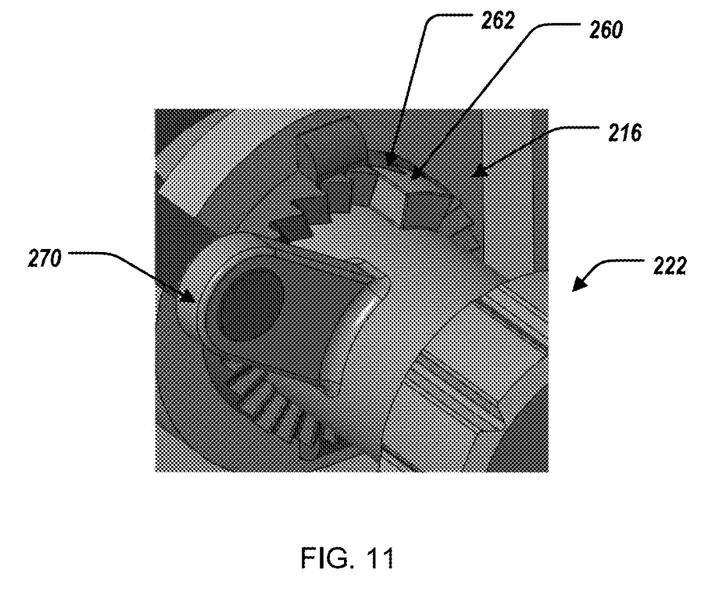
FIG. 11 illustrates the adjustable shaft of the hinge module in a second state.

Referring to FIG. 4, the second end 236 of the retractable shaft 210 can include a hollow portion 250. The adjustable shaft 222 can include a first end 252 and a second end 254 that is opposite to the first end 252. The first end 252 of the adjustable shaft 222 can be positioned within the hollow portion 250 of the retractable shaft 210, as shown in FIG. 3. The second end 254 of the adjustable shaft 222 can engage the ratchet stopper 216 to adjust a state of the torsion spring 214. Specifically, as shown in FIG. 10, the adjustable shaft 222 is in a first position with respect to the ratchet stopper 216. That is, teeth 260 of the adjustable shaft 222 can engage teeth 262 of the ratchet stopper 216 to establish the positioning of the adjustable shaft 222 with respect to the ratchet stopper 216. To that end, when the adjustable shaft 222 is in the first position with respect to the ratchet stopper 216, as shown in FIG. 10, the torsion spring 214 applies a first hinge force to the base bracket 204, shown in FIG. 3. The first hinge force applied by the torsion spring 214 to the base bracket 204 facilitates obtaining a desired positioning of the display device 202 with respect to the support system 205, shown in FIGS. 2A, 2B. When the adjustable shaft 222 is in the second position with respect to the ratchet stopper 216, as shown in FIG. 11, the torsion spring 214 applies a second hinge force to the base bracket 204, as shown in FIG. 3. That is, a tab 270 of the adjustable shaft 222 that is coupled to the ratchet stopper 216 is rotated towards the base bracket 204, thus adjusting the adjustable shaft 222 from the first position to the second position with respect to the ratchet stopper 216, with the torsion spring 214 applying the second hinge force to the base bracket 204. In some examples, the second hinge force is greater than the first hinge force. The second hinge force applied by the torsion spring 214 to the base bracket 204 facilities obtaining a desired positioning of the display device 202 with respect to the support system 205, as shown in FIGS. 2A, 2B. In some examples, the adjustable shaft 222 can be rotated 5 degrees between the first position and the second position. In some examples, the adjustable shaft 222 can be rotated multiple times with respect to the base bracket 204.

Figure 12:
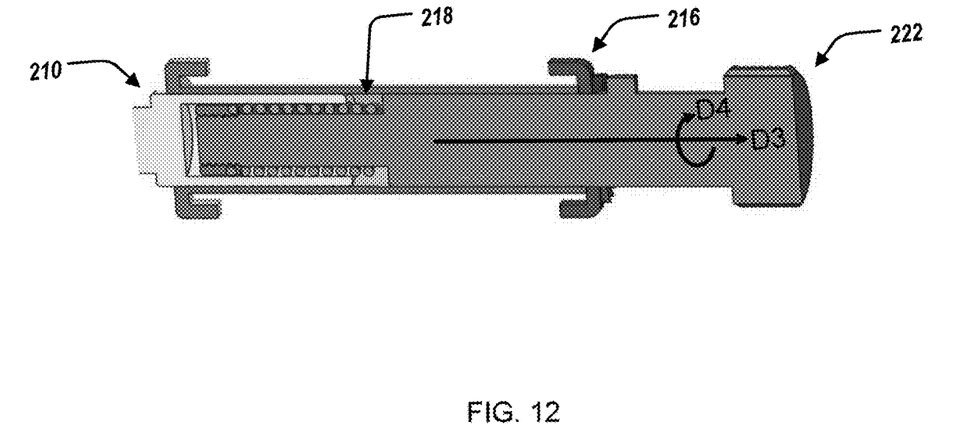
FIG. 12 illustrates a cut-away view of the hinge module in the first state.
Figure 13:
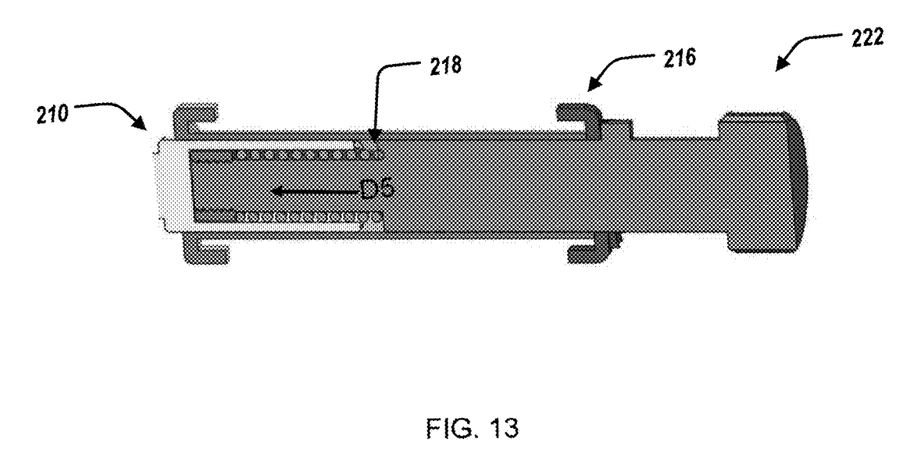
FIG. 13 illustrates a cut-away view of the hinge module in the second state.

Referring to FIG. 12, the adjustable shaft 222 is positionally rotatable with respect to the retractable shaft 210 to adjust the adjustable shaft 222 between the first and the second positions, shown in FIGS. 10 and 11, respectively. Specifically, the adjustable shaft 222 can be translated along the direction D3 such that the teeth 260 of the adjustable shaft 222 disengage from the teeth 262 of the ratchet stopper 216. After the teeth 260 of the adjustable shaft 222 disengage from the teeth 262 of the ratchet stopper 216, the adjustable shaft 222 is rotated along the direction D4—i.e., from the first position of the adjustable shaft 222 to the second position of the adjustable shaft 222. Referring to FIG. 13, once rotation of the adjustable shaft 222 is complete (e.g., rotated 5 degrees), the adjustable shaft 222 translates along the direction D5 such that the teeth 260 of the adjustable shaft 222 engage the teeth 262 of the ratchet stopper 216 to establish the second position of the adjustable shaft 222. Additionally, the compression spring 218 can provide a force opposite to the direction D3 to prevent movement of the adjustable shaft 222 along the axis of the hinge assembly 206. In other words, the compression spring 218 facilitates retracting of the adjustable shaft 222 towards the retractable shaft 210 to facilitate engaging the teeth 260 of the adjustable shaft 222 with the teeth 262 of the ratchet stopper 216.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A hinge module for an information handling system, comprising:
    a base bracket coupled to a display assembly of the information handling system;
    a hinge assembly coupled to the base bracket, including:
        a sleeve including at least a hollow portion at a first end of the sleeve;
        a retractable shaft, wherein a first end of the retractable shaft is positioned within the hollow portion of the sleeve, the retractable shaft adjustable between a first positional state and a second positional state with respect to the sleeve such that:
            when the retractable shaft is in the first positional state, i) a second end of the retractable shaft, opposite the first end of the retractable shaft, extends a first distance, along a first direction, from a second end of the sleeve that is opposite the first end of the sleeve, and ii) prevents rotational tilting of the display assembly along the first direction for a first tilt force less than a first threshold; and
            when the retractable shaft is in the second position state, i) the second end of the retractable shaft extends a second distance from the second end of the sleeve along the first direction, the second distance greater than the first distance, and ii) prevents rotational tilting of the display assembly along the first direction for a second force less than a second threshold, the second threshold greater than the first threshold.

2. The hinge module of claim 1, wherein:
    the sleeve further including a first pair of recesses and a second pair of recesses positioned within the hollow portion of the sleeve,
    the retractable shaft further including a compressible pin such that when the compressible pin is positioned within the first pair of recesses, the retractable shaft is in the first position, and when the compressible pin is positioned with the second pair of recesses, the retractable shaft is in the second position.

3. The hinge module of claim 2, wherein the compressible pin, when positioned within the first pair of recesses or the second pair of recesses, is fully extended, and when positioned between the first pair of recesses and the second pair of recesses, is compressed.

4. The hinge module of claim 1, wherein the second end of the retractable shaft includes a hollow portion, the hinge module further comprising:
    a torsion spring positioned around the hinge assembly;
    a ratchet stopper coupled to the torsion spring; and
    an adjustable shaft, wherein a first end of the adjustable shaft is positioned within the hollow portion of the retractable shaft, the adjustable shaft including a second end that engages the ratchet stopper to adjust a state of the torsion spring such that when the adjustable shaft is in a first position with respect to the ratchet stopper, the torsion spring applies a first hinge force to the base bracket, and when the adjustable shaft is in a second position with respect to the ratchet stopper, the torsion spring applies a second hinge force to the base bracket.

5. The hinge module of claim 4, further comprising an outer sheath, the outer sheath being hollow, with a portion of the retractable shaft and a portion of the adjustable shaft positioned within the outer sheath such that the torsion spring is positioned around the outer sheath.

6. The hinge module of claim 4, further comprising a compression spring positioned around the first end of the adjustable shaft to prevent movement of the adjustable shaft in a direction along an axis of the hinge assembly.

7. The hinge module of claim 4, wherein one or more teeth of the adjustable shaft engage one or more teeth of the ratchet stopper to establish the positioning of the adjustable shaft with respect to the ratchet stopper.

8. The hinge module of claim 4, wherein the adjustable shaft is positionally rotatable with respect to the retractable shaft to adjust between the first position and the second position.

9. An information handling system, comprising:
    a display assembly;
    a base bracket coupled to the display assembly;
    a hinge assembly coupled to the base bracket, including:
        a sleeve including at least a hollow portion at a first end of the sleeve;
        a retractable shaft, wherein a first end of the retractable shaft is positioned within the hollow portion of the sleeve, the retractable shaft adjustable between a first positional state and a second positional state with respect to the sleeve such that:
            when the retractable shaft is in the first positional state, i) a second end of the retractable shaft, opposite the first end of the retractable shaft, extends a first distance, along a first direction, from a second end of the sleeve that is opposite the first end of the sleeve, and ii) prevents rotational tilting of the display assembly along the first direction for a first tilt force less than a first threshold; and when the retractable shaft is in the second position state, i) the second end of the retractable shaft extends a second distance from the second end of the sleeve along the first direction, the second distance greater than the first distance, and ii) prevents rotational tilting of the display assembly along the first direction for a second force less than a second threshold, the second threshold greater than the first threshold.

10. The information handling system of claim 9, wherein:
the sleeve further including a first pair of recesses and a second pair of recesses positioned within the hollow portion of the sleeve,
the retractable shaft further including a compressible pin such that when the compressible pin is positioned within the first pair of recesses, the retractable shaft is in the first position, and when the compressible pin is positioned with the second pair of recesses, the retractable shaft is in the second position.

11. The information handling system of claim 10, wherein the compressible pin, when positioned within the first pair of recesses or the second pair of recesses, is fully extended, and when positioned between the first pair of recesses and the second pair of recesses, is compressed.

12. The information handling system of claim 9, wherein the second end of the retractable shaft includes a hollow portion, the hinge module further comprising:

a torsion spring positioned around the hinge assembly;
a ratchet stopper coupled to the torsion spring; and
an adjustable shaft, wherein a first end of the adjustable shaft is positioned within the hollow portion of the retractable shaft, the adjustable shaft including a second end that engages the ratchet stopper to adjust a state of the torsion spring such that when the adjustable shaft is in a first position with respect to the ratchet stopper, the torsion spring applies a first hinge force to the base bracket, and when the adjustable shaft is in a second position with respect to the ratchet stopper, the torsion spring applies a second hinge force to the base bracket.

13. The information handling system of claim 12, further comprising an outer sheath, the outer sheath being hollow, with a portion of the retractable shaft and a portion of the adjustable shaft positioned within the outer sheath such that the torsion spring is positioned around the outer sheath.

14. The information handling system of claim 12, further comprising a compression spring positioned around the first end of the adjustable shaft to prevent movement of the adjustable shaft in a direction along an axis of the hinge assembly.

15. The information handling system of claim 12, wherein one or more teeth of the adjustable shaft engage one or more teeth of the ratchet stopper to establish the positioning of the adjustable shaft with respect to the ratchet stopper.

16. The information handling system of claim 12, wherein the adjustable shaft is positionally rotatable with respect to the retractable shaft to adjust between the first position and the second position.

* * * * *